United States Patent [19]

Huber

[11] Patent Number: 4,851,358
[45] Date of Patent: Jul. 25, 1989

[54] SEMICONDUCTOR WAFER FABRICATION WITH IMPROVED CONTROL OF INTERNAL GETTERING SITES USING RAPID THERMAL ANNEALING

[75] Inventor: Walter Huber, Sunnyvale, Calif.

[73] Assignee: DNS Electronic Materials, Inc., Research Triangle Park, N.C.

[21] Appl. No.: 154,759

[22] Filed: Feb. 11, 1988

[51] Int. Cl.$^4$ .................. H01L 21/306; H01L 21/322
[52] U.S. Cl. .............................. 437/10; 148/DIG. 4; 148/DIG. 24; 148/DIG. 60; 148/DIG. 71; 357/526; 437/12; 437/19; 437/174; 437/942; 437/980; 437/248
[58] Field of Search ................ 148/DIG. 3, DIG. 4, 148/24, 60, 71, 125, 128; 357/52; 437/10–12, 19, 173, 174, 247, 936, 939, 942, 980, 248

[56] References Cited

U.S. PATENT DOCUMENTS

| | | | |
|---|---|---|---|
| 4,376,657 | 3/1983 | Nagasawa et al. | 437/10 |
| 4,432,809 | 2/1984 | Chye et al. | 437/10 |
| 4,544,418 | 10/1985 | Gibbons | 427/53.1 |
| 4,548,654 | 10/1985 | Tobin | 437/10 |
| 4,608,095 | 8/1986 | Hill . | |
| 4,622,082 | 11/1986 | Dyson et al. | 437/10 |
| 4,637,123 | 1/1987 | Cazcarra et al. | 437/10 |

FOREIGN PATENT DOCUMENTS

| | | | |
|---|---|---|---|
| 0060676 | 9/1982 | European Pat. Off. | 437/10 |
| 0201032 | 2/1982 | Japan | 437/939 |
| 0021829 | 2/1983 | Japan | 437/10 |
| 0204541 | 11/1983 | Japan | 437/10 |
| 0020337 | 1/1986 | Japan | 437/10 |

OTHER PUBLICATIONS

Craven et al., "Internal Gettering in Silicon", Solid State Tech., Jul. 1981, pp. 55–61.
Ueda et al., "Identification of Intrinsic Gettering . . . ", J. Appl. Phys., vol. 60, No. 2, 15 Jul. 1986, pp. 622–626.
Hu, "Precipitation of Oxygen in Silicon . . . ", J. Appl. Phys., vol. 52, No. 6, Jun. 1981, pp. 3974–3984.
Wolf et al., "Silicon Processing for the ULSI Era", Lattice Press Sunset Beach, California, 1986, pp. 66–70.
Hawkins and Lavine (1987) Materials Research Society Mtg., Nov. 30–Dec. 5.
Alvi et al. (1987) Electrochemical Soc. Mtg. Oct., 18–23.
Hahn et al. (1986), Material Research Society Symp. Proc., 59:287–292.
Chang-Outu and Tobin (1986), J. Electrochem. Soc. 133:2147–2152.
Jastrzebski et al. (1984), J. Electrochem. Soc. 131:2944–2953.
Inoue et al. (1981), in "Semiconductor Silicon 1981", ed. Huff. et al., Proc. vol. 81–85, The Electrochemical Society, pp. 282–293.

*Primary Examiner*—Brian E. Hearn
*Assistant Examiner*—William Bunch
*Attorney, Agent, or Firm*—Townsend & Townsend

[57] ABSTRACT

The concentration of internal gettering sites within a semiconductor wafer is controlled by two-step thermal processing. In a concentration reduction phase, the wafer is rapidly heated to an elevated temperature in the range from about 900° to 1350° C., resulting in the partial or total dissolution of precipitable impurities within the wafer. In a concentration enhancement step, the wafers are subjected to a relatively low temperature anneal process where the density of potential internal gettering sites is increased. By properly controlling the processing temperatures and treatment times, the two steps may be performed in either order to obtain wafers having internal gettering site concentrations within a desired range.

8 Claims, No Drawings

SEMICONDUCTOR WAFER FABRICATION WITH IMPROVED CONTROL OF INTERNAL GETTERING SITES USING RAPID THERMAL ANNEALING

BACKGROUND OF THE INVENTION

1. Field of the Invention

The present invention relates generally to the fabrication of semiconductor wafer substrates. More particularly, the invention relates to the fabrication of silicon wafer substrates under conditions which control the concentration of internal gettering sites.

Single-crystal silicon, the starting material for most semiconductor fabrication processes, is most commonly prepared by the Czochralski method wherein a single seed crystal is dipped into molten silicon and slowly withdrawn. By rotating the crystal, a cylindrical ingot having a desired diameter is produced. The molten silicon is held in a quartz crucible.

Although characterized by very high purity, Czochralski method silicon crystals have a certain level of impurities. Most importantly, oxygen derived from the quartz crucible is present in concentrations from about 10 to 20 ppma. Such concentrations are above solid solubility at temperatures typical for integrated circuit manufacture processes. Being in supersaturated solution, the oxygen atoms will tend to precipitate. The precipitation of oxygen provides trapping sites for impurities detrimental for the performance of integrated circuits. This technique for removing impurities away from the vicinity of the active wafer surface by oxygen precipitation is referred to as "internal gettering."

Heretofore, the benefits associated with gettering caused by internal oxygen precipitation clusters have been somewhat serendipitous. Although the initial concentration of dissolved oxygen in the silicon ingots may be controlled, the concentration of gettering sites which are generated on subsequent thermal treatment of individual wafers depends on a number of factors and will vary widely. Thus, while the optimum concentration of gettering sites for a particular application may be known, the actual concentration present in a wafer undergoing processing has been very difficult to adjust to a specific concentration.

It would therefore be desirable to provide methods for controlling the concentration of gettering sites present in semiconductor substrates. More particularly, it would be desirable to provide methods capable of controlling the concentration of oxygen precipitation sites within silicon substrates prepared by the Czochralski method and other conventional silicon preparation methods.

2. Description of the Background Art

Hawkins and Lavine (1987) Materials Research Society Mtg., Nov. 30–Dec. 5, demonstrate a putative heterogeneous nucleation mechanism for oxygen in silicon by subjecting a wafer first to a rapid thermal anneal followed by annealing at 950° C. for one hour and 1200° C. for 13 hours. No optimization of internal gettering site concentration is disclosed. Alvi et al. (1987) Electrochemical Society Mtg., Oct. 18–23, describe the effect of rapid thermal annealing on the dissolution of metallic precipitates in silicon wafers. Hahn et al. (1986) Material Research Society Symp. Proc. 59:287–292, describe the formation of thermal donors by the annealing of silicon wafers at 450° C., followed by rapid thermal annealing at 600° C. to 1000° C., followed further by two-step furnace annealing at 700° C. and 950° C. The paper does not consider the desirability of re-establishing a desired concentration of oxygen precipitates. Chang-Outu and Tobin (1986) J. Electrochem. Soc. 133:2147–2152, suggests that the precipitation of oxygen in wafer fabrication processes depends strongly on the initial concentration of dissolved oxygen in the silicon. An initial oxygen concentration in the range from about 14 to 16 ppma is taught to be optimum for subsequent gettering of impurities. Jastrzebski et al. (1984) J. Electrochem. Soc. 131:2944–2953 suggest a correlation between the amount of precipitated oxygen and the particular conditions of silicon wafer fabrication. Inoue et al. (1981) in "Semiconductor Silicon 1981", ed. Huff et al., Proc. Vol. 81-5, The Electrochemical Society, pp 282–293, teaches that the concentration of oxygen precipitates in a silicon wafer can be increased by low temperature annealing. Finally, U.S. Pat. No. 4,608,095, relates to external gettering by providing a layer of polysilicon on the rear surface of the wafer.

SUMMARY OF THE INVENTION

According to the present invention, methods are provided for controlling the concentration of internal gettering sites, such as oxygen clusters, within a semiconductor substrate. The methods rely on a two-step process where the concentration of gettering sites is first either substantially increased or substantially decreased. By increasing the gettering site concentration above the desired optimum level, the concentration can then be reduced to the desired optimum level by rapid heating at a particular temperature or range of temperatures for a preselected time period. Alternatively, by initially reducing the concentration of internal gettering sites below the desired optimum, the concentration may then be increased by thermal annealing at relatively moderate temperatures for a preselected time period. In this way, the final concentration of internal gettering sites is dependent neither on the initial impurity concentration nor the processing history of the semiconductor wafer crystal.

In the exemplary embodiment, silicon wafer substrates are first rapidly heated to an elevated temperature in the range from about 900° to 1300° C., preferably from about 1000° to 1250° C. The heating rate is usually at least about 10° C. per second, preferably being at least about 100° C. per second, and the wafer substrate will be maintained at the elevated temperature for a period of at least about 1 second, usually for a period of at least about 5 seconds, depending on the precise temperature to which the wafer has been heated. Such rapid heating of the silicon substrates has been found to substantially reduce the concentration of relatively small oxygen clusters (i.e., those capable of growing into gettering sites) in the silicon wafer substrates. Usually, the concentration of small oxygen clusters will be reduced sufficiently to achieve an internal gettering site concentration below about $10^6/cm^2$, frequently being reduced to less than about $10^5/cm^2$ and occasionally being reduced to less than about $10^4/cm^2$.

After the initial reduction, the concentration of relatively small oxygen clusters may be increased to a desired optimum level by annealing the substrates at a relatively moderate temperature, typically in the range from about 550° to 850° C., more typically in the range from about 600° to 750° C., for a relatively long time period, typically in the range from about 15 to 360 minutes, usually being from one to four hours. The precise time and temperature of the annealing will be selected to provide the optimum gettering site concentration, usually in the range from about $10^5$ to $5 \times 10^6/cm^2$, more usually in the range from about $2 \times 10^5$ to $10^6/cm^2$.

After the wafers are treated by the process of the present invention, they are ready for conventional wafer fabrication processes where active regions are formed on the upper surface thereof. During such conventional processes, impurities within the semiconductor wafer will be attracted to the oxygen cluster gettering sites and away from the active surface of the wafer.

DESCRIPTION OF THE SPECIFIC EMBODIMENTS

The present invention provides a method for controlling the concentration of internal gettering sites within semiconductor substrates used in the fabrication of integrated circuits. Internal gettering sites evolve from the coalescing of certain impurities into clusters having a critical threshold mass. Such clusters attract other deleterious impurities during subsequent thermal processing of the semiconductor wafer. By drawing such deleterious impurities away from the active surface of the substrate, integrated circuit yield and performance can be greatly improved.

Without pretreatment of the wafers, the concentration of the internal gettering sites may vary widely, typically within a range from about $10^4$ to $10^7$ sites/cm$^2$. Desirably, the concentration of such sites at the commencement of the normal wafer fabrication processes will be in the range from about $10^5$ to $5 \times 10^6$ sites/cm$^2$, preferably in the range from about $2 \times 10^5$ to $10^6$ sites/cm$^2$.

Control over the concentration of the internal gettering sites is achieved by pretreating the wafer in a two-step procedure including both a concentration reduction phase and a concentration enhancement phase for the impurity clusters. By initiating the concentration reduction phase first, the concentration of impurity clusters having the critical mass is reduced below the desired level. The desired level may then be achieved by performing the concentration enhancement phase under preselected conditions and for a time chosen to provide the precise concentration desired. Inversely, by initiating the concentration enhancement phase first, the concentration of impurity clusters having the critical mass may be increased above the desired level. The desired concentration may then be achieved by performing the concentration reduction phase under conditions and for a time chosen to provide the desired level.

The method of the present invention is used to control the concentration of internal gettering sites in single-crystal semiconductor wafers used in the fabrication of integrated circuits for the electronics industry. While silicon will normally be the wafer material of choice, other semiconductor materials, such as gallium arsenide, indium phosphide, gallium aluminum arsenide, germanium, silicon carbide, indium antimonide, and the like, may also find use. The semiconductor materials may possess any conventional crystal lattice orientation and resistivity, and will be of conventional dimensions as used in the wafer fabrication industry.

The semiconductor materials employed will contain impurities, including both precipitable impurities which will coalesce into clusters which act as the gettering sites and deleterious impurities, usually metallic impurities, which will be removed from the active surface of the semiconductor substrate by the gettering sites. Desirably, the deleterious impurities will be substantially removed from a one to 50 micron layer immediately beneath the active surface, more typically from a 10 to 30 micron layer immediately below the active surface.

The precipitable impurities will comprise mobile atoms capable of coalescing into clusters having an empirically-derived critical mass under the processing conditions specified herein. Usually, the precipitable impurities will be present in the semiconductor material as a result of the initial crystal growth process, although in some cases it may be necessary or desirable to intentionally introduce the impurities during the growth process. In silicon semiconductor crystals produced by the Czochralski process, the precipitable impurity will normally be oxygen atoms which are derived from the quartz crucible liner which holds the molten silicon from which the crystals are drawn. The oxygen will usually be present at a concentration near the solubility limit, typically in the range from about 10 to 20 ppma (parts per million atomic basis as measured by ASTM F121-83), usually being between about 12 to 18 ppma. Other impurities and defects, such as nitrogen, carbon, silicon native defects and the like, may be added during the crystal growth phase if it is desired to raise the concentration of the precipitable impurities.

When the silicon crystal is produced by the float-zone process, the precipitable impurities must be intentionally added. Precipitable impurities, such as nitrogen, oxygen, carbon, and the like, may be utilized. Conveniently, the precipitable impurity will be nitrogen introduced by crystal growth in a nitrogen-containing environment to a concentration in the range from about 0.1 to 10 ppma.

The semiconductor material produced by both the Czochralski process and the float-zone process will be in the form of large cylindrical ingots which will be sliced into individual wafers, typically having a thickness in the range from about 10 to 50 mils, more typically in the range from about 15 to 27 mils, the wafers are sliced using diamond slicing saws, and may be treated by the method of the present invention either immediately after slicing or subsequent to further preparation steps. Such further preparation steps include lapping to remove irregularities caused by the slicing and polishing to produce an optical quality surface. Additionally, the wafers may be coated with thin films, including oxides, nitrides, polysilicon layers, and the like. Any layers deposited prior to processing according to the present invention must be able to withstand the processing conditions described hereinafter.

The deleterious impurities which are attracted by the gettering sites in the wafers include primarily metallic species, such as iron, nickel, copper, titanium, and the like. The contaminants will collect at the gettering sites during the normal thermal processing of the wafers utilized to construct the integrated circuit devices.

The internal gettering sites will be clusters of the precipitable impurities, typically oxygen or nitrogen, having a critical mass or number of atoms, which is sufficiently large so that the sites will attract the impurities during the subsequent thermal processing of the wafer. The precise mass will vary depending both on the nature of the semiconductor material and on the nature of the precipitable impurity. Operationally, gettering sites may be defined as clusters capable of attracting the deleterious impurities under the thermal processing conditions employed in semiconductor fabrication, typically in a temperature range from about 400° to 1250° C., more typically in a range from about 800° to 1150° C. Untreated wafers will generally have a distribution of precipitable impurity cluster sizes, with those larger than the critical mass threshold size being capable of growing and attracting impurities and defects during the wafer fabrication processes. Without control, the concentration of such gettering sites may vary broadly in the range from about $10^4$ to $10^7$ sites/cm$^2$. The desired range is from about $10^5$ to $5 \times 10^6$ sites/cm$^2$, usually from about $2 \times 10^5$ to $10^6$ sites/cm$^2$, may be achieved by the method of the present invention.

The internal gettering site concentration reduction phase comprises rapid heating of the semiconductor wafer from a temperature below about 100° C., usually being about room temperature, to a final temperature in the range from about 900° C. to 1300° C., more usually being from about 1000° C. to 1250° C., preferably being from about 1050° C. to 1200° C. The heat treatment time at the elevated temperature will vary as a function of the final temperature, with lower temperatures requiring generally longer treatment times. The treatment time must be sufficiently long to allow dissolution of the clusters of precipitable impurities initially present in the wafer so that the concentration of clusters having the critical growth mass will be below the desired level, typically being below about $10^6$ sites/cm$^2$, more typically being below about $10^5$ sites/cm$^2$, and occasionally being below about $10^4$ sites/cm$^2$. Conveniently, for Czochralski silicon wafers having internal oxygen impurities, the following time and temperature relationship has been found suitable.

TABLE 1

| Final Treatment Temperature | Heat Treatment Time |
| --- | --- |
| 1000° C. | >20 sec. |
| 1050° C. | >10 sec. |
| 1100° C. | >5 sec. |
| 1150° C. | >2 sec. |
| 1200° C. | >1 sec. |
| 1250° C. | >1 sec. |

The time and temperature relationship set forth in Table 1 is based on silicon wafers having an average initial oxygen concentration in the range from about 10 ppma to about 20 ppma, more usually being in the range from about 12 ppma to 18 ppma (ASTM F121-83). In some cases, it may be desirable to empirically develop specific time and temperature relationships for particular types of wafers having known impurities, crystal lattice orientations, resistivities, and the like. The temperature and treatment time required to control the internal gettering site concentration to within the desired range may then be determined as a function of the measured initial oxygen concentration of the particular wafer. That is, by measuring the initial oxygen concentration of each wafer or batch of wafers being treated (conveniently by ASTM F121-83) the wafers may be precisely treated to gain the desired gettering site concentrations.

Rapid heating of the wafers comprises a heating rate of at least about 10° C./sec., preferably being at least about 100° C./sec. or greater. Such rapid heating may be accomplished by radiant heating, typically using rapid thermal processing equipment commercially available from suppliers such as Peak Systems, Inc., Fremont, Calif., Varian Associates, Palo Alto, Calif., and AG Associates, Sunnyvale, Calif. In particular, a Heat Pulse Model 210T available from AG Associates has been found suitable for practicing the concentration reduction phase of the method of the present invention. The rapid heating will be performed under an inert or non-oxidizing atmosphere, typically argon or nitrogen.

After completing the rapid thermal heating step, it is necessary to rapidly cool the wafers down to a temperature below about 600° C., typically back down to about room temperature. The cooling should be achieved at a rate of at least about −10° C./sec., preferably being at least about −50° C./sec. When employing the rapid thermal processing equipment described above, such cooling may be effected by simply turning off the radiant heat sources.

The concentration enhancement phase of the present invention comprises annealing the wafers by heating to a temperature in the range from about 550° to 850° C., usually in the range from about 600° to 750° C., for a retention time selected to enhance the formation of precipitable clusters so that the concentration of internal gettering sites is within the desired range set forth above. Typically, the treatment time will be in the range from about 15 minutes to 360 minutes or greater, more typically being from about one to four hours. Such low temperature treatment will typically be carried out in a conventional batch furnace under an inert or non-inert atmosphere. Alternatively, it would also be possible to perform the concentration enhancement phase using rapid thermal processing equipment, although usually it would not be preferred.

Normally, the temperature of the wafer will be ramped up from room temperature to the anneal temperature at a rate in the range from about 1° to 20° C. per minute, more usually in the range from about 2° to 10° C. per minute. Such rates, however, are not critical and faster ramping would be acceptable so long as the total treatment time within the desired temperature range results in the desired increase in concentration of internal gettering sites. Once the final anneal temperature is reached, the temperature will usually be maintained steady until the retention time is expired and it is desired to cool the wafer. There is no theoretical reason, however, why the temperature could not be varied during the low temperature anneal treatment so long as at the end the desired concentration of internal gettering sites is achieved.

As stated above, the order of the concentration reduction phase and the concentration enhancement phase is not critical, and it is possible to perform either processing step initially. Preferably, however, the concentration enhancement phase will be accomplished first in order to increase the concentration of internal gettering sites well above the desired level. It has been found that the concentration reduction phase is somewhat more reproducible than the enhancement phase. Thus, by performing the reduction phase last, a more precise concentration of internal gettering sites may be obtained.

After treatment according to the present invention, the semiconductor wafers are ready for conventional semiconductor fabrication operations in order to form the desired integrated circuits on the active surface of the wafer. The wafers may be utilized for any of the conventional microelectronic technologies, including thick-film hybrid, thin-film hybrid, bipolar monolithic, and metal oxide semiconductor (MOS) monolithic technologies. The internal gettering sites created during the method of the present invention will act to attract impurities and crystalline defects from the active surface of the wafer during the normal thermal exposure of the wafer during conventional processing steps. In this way, the impurities and defects are removed from the active surface in order to improve the device yield on the wafer.

The following examples are offered by way of illustration, not by way of limitation.

EXPERIMENTAL

1. Experimental Procedure

The effects of rapid thermal processing (RTP) on oxygen precipitation were demonstrated on p-type silicon wafers with extrinsic gettering capabilities which are provided by a polysilicon layer on the backside of the wafer. A low pressure chemical vapor deposition (LPCVD) reactor was employed for the polysilicon deposition, and operated in the 650° C. to 700° C. temperature range. This temperature range enhanced the formation of oxygen clusters in the bulk of the wafer and, consequently, oxygen precipitation in subsequent IC manufacture steps. A number of p-type silicon wafers having oxygen concentrations of 15.6 ppma (ASTM F-121-83), and a polysilicon layer on the backside, were rapidly annealed from 1100° to 1200° C. for times ranging from 10 to 30 seconds.

P-type silicon wafers with oxygen contents ranging from 15 to 18 ppma and a standard chemically etched backside were heat treated in a conventional furnace at temperatures ranging from 700° to 800° C. for 1 to 4 hours. These conditions increased the density of oxygen clusters in the bulk of the wafers. After the low temperature anneal, the silicon wafers were subjected to a 30 second rapid thermal anneal with temperatures ranging from 1100° to 1200° C.

Another set of p-type silicon wafers with a standard backside were first rapidly heat treated at temperatures ranging from 1000° to 1200° C. For all temperatures, the anneal time was 30 seconds. After the rapid thermal treatment, the wafers were annealed in a conventional tube furnace at 700° to 800° C. The low temperature treatment times varied from 2 hours to 4 hours.

The rapid thermal treatments were carried out in a commercially available system manufactured by AG Associates (Heat Pulse Model 210T). In this system, the annealing chamber is heated by two banks of tungsten-halogen lamps. A quartz diffusion tube positioned between the two lamp banks contains the silicon wafer. During the short heat cycle, the tube was continuously purged with argon. The wafer temperature was monitored by a very low mass thermocouple mounted next to the wafer and controlled by a closed-loop temperature controller.

Prior to any heat treatment, the interstitial oxygen content of the silicon wafers was determined with an FTIR spectrophotometer (ASTM F-121-83). The interstitial oxygen content was again measured after the extended oxygen precipitation cycle described in Table 2. This heat cycle was employed after the rapid thermal and low temperature anneal so the effects of both thermal treatments on oxygen precipitation could be evaluated. The difference in oxygen concentration before and after this precipitation cycle, therefore, is a measure for the density of internal gettering sites in the bulk of the silicon wafer, and is referred to as a drop in interstitial oxygen in this application. The oxygen precipitate density present in the bulk of the wafer after the heat cycle of Table 2 was determined from a cleaved cross section that was etched with a Secco etch solution for 2.5 minutes. Both characterization techniques are widely used in the electronics industry.

TABLE 2

| Process Conditions for the Precipitation Cycle | |
|---|---|
| Push | 6"/min., 900° C., oxygen ambient |
| Soak | 900° C., oxygen ambient, 30 minutes |
| Ramp | From 900° C. to 1025° C., oxygen ambient |
| Anneal | 1025° C., nitrogen ambient, 8 hours |
| Ramp | From 1025° C. to 1000° C., nitrogen ambient |
| Pull | 6"/min., 1000° C., nitrogen ambient |

2. Experimental Results and Discussion

The change in interstitial oxygen and oxygen precipitate density in silicon wafers with a polysilicon layer on the backside was determined, as described above, and the average values are given in Table 3. From the tabulated results it can be seen that the internal gettering sites created during the polysilicon deposition can be either partially or completely dissolved after a short rapid thermal processing step. After a 1200° C. treatment, the oxygen precipitation kinetics in a silicon wafer with a polysilicon layer on the backside became indistinguishable from a wafer with a standard backside. The application of this invention, therefore, allows an independent control of the intrinsic and extrinsic gettering capabilities of silicon wafers.

TABLE 3

| | Silicon Wafers with Extrinsic Gettering Capabilities of a Polysilicon Layer | | | |
|---|---|---|---|---|
| Wafer | Rapid Thermal Treatment Conditions | Initial Oxygen Content, ppma | Drop in Interstitial Oxygen Content, ppma | Precipitate Density, $cm^{-2}$ |
| A | No | 15.9 | 5.4 | $5.3 \times 10^6$ |
| B | 1100° C., 20 sec. | 15.6 | 1.9 | $1.7 \times 10^6$ |
| C | 1200° C., 10 sec. | 15.6 | 0.3 | |
| D | 1200° C., 30 sec. | 15.6 | 0.4 | $3.2 \times 10^4$ |
| E (Control) | 1200° C., 30 sec. | 16.2 | 0.4 | $4.8 \times 10^4$ |

Table 4 summarizes the average of the results obtained on standard silicon wafers that first were pre-annealed at low temperatures and then rapidly heat treated. The data show that the amount of precipitated oxygen can be controlled by choosing the proper pre-anneal and rapid thermal anneal conditions. The effect of rapid thermal processing diminishes for higher pre-anneal temperatures.

TABLE 4

| | Silicon Wafers with a Low Temperature Anneal Prior to the RTP Treatment | | | |
|---|---|---|---|---|
| Wafer | Low Temperature Anneal Conditions | Rapid Thermal Treatment Conditions | Initial Oxygen Content, ppma | Drop in Interstitial Oxygen Content, ppma |
| A | 700° C., 1 hr. | — | 15.1 | 3.2 |
| B | 700° C., 1 hr. | — | 16.5 | 6.3 |
| C | 700° C., 1 hr. | — | 17.9 | 11.9 |
| D | 700° C., 1 hr. | 1100° C., 30 sec. | 15.3 | 1.1 |
| E | 700° C., 1 hr. | 1100° C., 30 sec. | 17.7 | 10.8 |
| F | 700° C., 1 hr. | 1200° C., 30 sec. | 15.2 | 0.5 |
| G | 700° C., 1 hr. | 1200° C., 30 sec. | 16.6 | 1.0 |
| H | 700° C., 1 hr. | 1200° C., 30 sec. | 17.7 | 4.1 |

TABLE 4-continued

Silicon Wafers with a Low Temperature Anneal Prior to the RTP Treatment

| Wafer | Low Temperature Anneal Conditions | Rapid Thermal Treatment Conditions | Initial Oxygen Content, ppma | Drop in Interstitial Oxygen Content, ppma |
|---|---|---|---|---|
| I | 700° C., 4 hr. | — | 15.3 | 7.0 |
| J | 700° C., 4 hr. | 1100° C., 30 sec. | 15.3 | 5.7 |
| K | 700° C., 4 hr. | 1200° C., 30 sec. | 15.3 | 1.9 |
| L | 800° C., 1 hr. | — | 17.6 | 8.6 |
| M | 800° C., 1 hr. | 1100° C., 30 sec. | 18.0 | 8.6 |
| N | 800° C., 1 hr. | 1200° C., 30 sec. | 18.1 | 9.3 |
| O (Control) | — | 1100° C., 30 sec. | 14.9 | 0.2 |
| P (Control) | — | 1200° C., 30 sec. | 15.6 | 0.2 |

For silicon wafers rapidly annealed prior to a low temperature treatment, the drop in interstitial oxygen and precipitate density was recorded as described above and the averages of the results are summarized in Table 5. The presented data demonstrate that a short rapid thermal treatment prior to a low temperature anneal also considerably affects the oxygen precipitation. The amount of precipitated oxygen in a silicon wafer decreases as the rapid thermal anneal temperatures increase.

TABLE 5

As-Grown Silicon Wafers with an RTP Treatment Prior to a Low Temperature Anneal

| Wafer | Rapid Thermal Treatment Conditions | Low Temperature Anneal | Initial Oxygen Content, ppma | Drop in Interstitial Oxygen Content, ppma | Precipitate Density, cm$^{-2}$ |
|---|---|---|---|---|---|
| A | — | 700° C., 2 hrs. | 14.6 | 1.5 | |
| B | — | 700° C., 2 hrs. | 15.2 | 5.0 | 5.5 × 10$^6$ |
| C | — | 700° C., 2 hrs. | 17.1 | 11.2 | |
| D | — | 700° C., 2 hrs. | 15.1 | 7.3 | |
| E | 1000° C., 30 sec. | 700° C., 2 hrs. | 14.9 | 1.9 | 8.5 × 10$^5$ |
| F | 1000° C., 30 sec. | 700° C., 2 hrs. | 15.0 | 4.8 | 2.2 × 10$^6$ |
| G | 1000° C., 30 sec. | 700° C., 2 hrs. | 17.2 | 9.8 | |
| H | 1050° C., 30 sec. | 700° C., 2 hrs. | 15.1 | 1.5 | |
| I | 1050° C., 30 sec. | 700° C., 4 hrs. | 15.4 | 4.0 | 1.8 × 10$^6$ |
| J | 1050° C., 30 sec. | 700° C., 2 hrs. | 17.3 | 3.6 | |
| K | 1100° C., 30 sec. | 700° C., 2 hrs. | 15.0 | 0.4 | 6.4 × 10$^4$ |
| L | 1100° C., 30 sec. | 700° C., 4 hrs. | 15.0 | 1.1 | 7.5 × 10$^5$ |
| M | 1100° C., 30 sec. | 700° C., 2 hrs. | 17.0 | 1.1 | |
| N | 1200° C., 30 sec. | 700° C., 2 hrs. | 14.9 | 0.5 | 1.4 × 10$^5$ |
| O | 1200° C., 30 sec. | 700° C., 4 hrs. | 14.9 | 1.4 | 6.4 × 10$^5$ |
| P | 1200° C., 30 sec. | 700° C., 2 hrs. | 16.9 | 0.9 | |
| Q | — | 800° C., 2 hrs. | 17.3 | 11.3 | |
| R | 1000° C., 30 sec. | 800° C., 2 hrs. | 17.2 | 9.0 | |
| S | 1050° C., 30 sec. | 800° C., 2 hrs. | 17.0 | 1.0 | |
| T | 1200° C., 30 sec. | 800° C., 2 hrs. | 16.6 | 0.4 | |
| U | 1200° C., 30 sec. | — | 15.7 | 0.5 | |
| V | — | — | 15.2 | 0.4 | |

The data of Tables 4 and 5 demonstrate that the density of internal gettering sites in the bulk of a silicon wafer can be individually adjusted to a desired level independent of the initial oxygen content.

Although the foregoing invention has been described in some detail by way of illustration and example for purposes of clarity of understanding, it will be obvious that certain changes and modifications may be practiced within the scope of the appended claims.

What is claimed is:

1. A method for imparting a desired concentration of internal gettering sites in a semiconductor substrate, said method comprising performing the following steps in a predetermined order:
   (a) rapidly heating the substrate to a temperature in the range from about 900° to 1300° to reduce the concentration of gettering sites, said heating being performed at a rate of at least 10° C./sec;
   (b) rapidly cooling the substrate to a temperature below about 600° C. to fix the reduced concentration of gettering sites; and
   (c) annealing the substrate at a temperature in the range from about 550° C. to 850° C. for a predetermined time period to increase the concentration of gettering sites.

2. A method as in claim 1, wherein step (a) is performed first at a temperature and for a time selected to reduce the concentration of gettering sites below 10$^5$ sites/cm$^2$ and step (c) is performed thereafter at a temperature and for a time sufficient to produce a concentration of internal gettering sites in the range from 10$^5$ to 5 × 10$^6$ sites/cm$^2$.

3. A method as in claim 1, wherein step (c) is performed first at a temperature and for a time selected to increase the concentration of internal gettering sites above 5 × 10$^6$ sites/cm$^2$, and step (a) is performed thereafter at a temperature and for a time selected to reduce the internal gettering sites to a concentration in the range from about 10$^5$ to 5 × 10$^6$ sites/cm$^2$.

4. A method as in claim 1, wherein the semiconductor substrate is composed of a material selected from the group consisting of silicon and III–V compound semiconductors.

5. A method as in claim 4, wherein the semiconductor substrate is silicon produced by the Czochralski process and the internal gettering sites are oxygen clusters.

6. A method as in claim 4, wherein the semiconductor substrate is silicon produced by the float zone process and the internal gettering sites are clusters of nitrogen, oxygen, carbon, or silicon.

7. A method as in claim 1, where in step (a) the substrate is rapidly heated from room temperature to the desired temperature and maintained at the desired temperature for a period of at least one second.

8. A method as in claim 1, where in step (c) the substrate is held at the desired temperature for a period of at least 15 minutes.

* * * * *